(12) United States Patent
Lee et al.

(10) Patent No.: US 12,382,681 B2
(45) Date of Patent: Aug. 5, 2025

(54) MULTI-BRIDGE CHANNEL FIELD EFFECT TRANSISTOR WITH REDUCED GATE-CHANNEL LEAKAGE CURRENT

(71) Applicant: SAMSUNG ELECTRONICS CO., LTD., Suwon-si (KR)

(72) Inventors: Doohyun Lee, Hwaseong-si (KR); Heonjong Shin, Yongin-si (KR); Seonbae Kim, Hwaseong-si (KR); Sungmin Kim, Incheon (KR); Jinyoung Park, Hwaseong-si (KR); Hyunho Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 608 days.

(21) Appl. No.: 17/574,074

(22) Filed: Jan. 12, 2022

(65) Prior Publication Data
US 2022/0406888 A1   Dec. 22, 2022

(30) Foreign Application Priority Data
Jun. 22, 2021   (KR) .......................... 10-2021-0080512

(51) Int. Cl.
*H10D 62/10*   (2025.01)
*H10D 30/67*   (2025.01)
(Continued)

(52) U.S. Cl.
CPC ....... *H10D 62/112* (2025.01); *H10D 30/6735* (2025.01); *H10D 62/115* (2025.01);
(Continued)

(58) Field of Classification Search
CPC ............ H01L 29/0638; H01L 29/0665; H01L 29/42392; H01L 29/78648;
(Continued)

(56) References Cited

U.S. PATENT DOCUMENTS 9,978,835 B2   5/2018   Yang et al.
9,984,936 B1 *  5/2018   Xie ................... H01L 29/66439
(Continued)

FOREIGN PATENT DOCUMENTS

CN   106449596 A   2/2017

*Primary Examiner* — Eliseo Ramos Feliciano
*Assistant Examiner* — Brad A Knudson
(74) *Attorney, Agent, or Firm* — Sughrue Mion, PLLC

(57) ABSTRACT

A semiconductor device is provided. The semiconductor device includes: an active pattern provided on a substrate having an upper surface; an insulation pattern provided above the substrate and contacting an upper surface of the active pattern; channels spaced apart from each other along a direction perpendicular to the upper surface of the substrate, each of the channels including a material provided in the active pattern; and a gate structure contacting an upper surface of the insulation pattern, an upper surface of the channels, a lower surface of the channels, and sidewalls of the channels opposite to each other. A first distance between an upper surface of the active pattern and a lowermost one of the channels is greater than a second distance between an upper surface of one of the channels and a lower surface of an adjacent channel.

20 Claims, 18 Drawing Sheets

(51) Int. Cl.
*H10D 64/27* (2025.01)
*H10D 30/01* (2025.01)
*H10D 64/23* (2025.01)

(52) U.S. Cl.
CPC ......... *H10D 62/118* (2025.01); *H10D 62/121* (2025.01); *H10D 64/518* (2025.01); *H10D 30/026* (2025.01); *H10D 30/031* (2025.01); *H10D 30/6757* (2025.01); *H10D 64/258* (2025.01)

(58) Field of Classification Search
CPC ......... H01L 29/41775; H01L 29/66742; H01L 29/42376; H01L 29/78696; H01L 29/66787; H01L 29/0649; H01L 29/0673; H10D 62/112; H10D 30/6735; H10D 62/115; H10D 62/118; H10D 62/121; H10D 64/518; H10D 30/026; H10D 30/031; H10D 30/6757; H10D 64/258
See application file for complete search history.

(56) References Cited

U.S. PATENT DOCUMENTS

| | | | |
|---|---|---|---|
| 9,997,463 | B2 | 6/2018 | Zhang |
| 10,038,054 | B2 | 7/2018 | Rachmady et al. |
| 10,103,238 | B1* | 10/2018 | Zang .................... H10D 64/017 |
| 10,115,788 | B2 | 10/2018 | Ching et al. |
| 10,418,487 | B2 | 9/2019 | Rachmady et al. |
| 10,629,538 | B2 | 4/2020 | Zhang |
| 10,930,793 | B2 | 2/2021 | Chao et al. |
| 11,195,911 | B2* | 12/2021 | Xie .................... H01L 29/66545 |
| 2017/0256609 | A1* | 9/2017 | Bhuwalka ......... H01L 29/78696 |
| 2017/0309706 | A1* | 10/2017 | Cheng ................ H01L 29/0665 |
| 2020/0152734 | A1* | 5/2020 | Frougier ............ H10D 84/0151 |
| 2020/0219978 | A1 | 7/2020 | Guler et al. |
| 2020/0357884 | A1* | 11/2020 | Xie ....................... H01L 29/165 |
| 2021/0074809 | A1* | 3/2021 | Xie .................... H01L 29/66545 |
| 2022/0344213 | A1* | 10/2022 | Lin ................. H01L 21/823481 |

* cited by examiner

MULTI-BRIDGE CHANNEL FIELD EFFECT TRANSISTOR WITH REDUCED GATE-CHANNEL LEAKAGE CURRENT

CROSS-REFERENCE TO RELATED APPLICATION

This application claims priority under 35 U.S.C. § 119 to Korean Patent Application No. 10-2021-0080512 filed on Jun. 22, 2021 in the Korean Intellectual Property Office, the disclosure of which is hereby incorporated by reference in its entirety.

FIELD

Methods, apparatuses and systems consistent with example embodiments relate to a semiconductor device, and more particularly, to a semiconductor device having a plurality of channels vertically stacked.

RELATED ART

Recently, as a semiconductor device is highly integrated, a separation distance between source/drain layers of a transistor may also be reduced. The reduced separation distance may cause electrical characteristics of the semiconductor device to be deteriorated.

SUMMARY

Example embodiments provide a semiconductor device having improved characteristics.

According to example embodiments, a semiconductor device includes: an active pattern provided on a substrate having an upper surface that extends in a first direction and a second direction that crosses the first direction, the active pattern extending in the first direction; an insulation pattern provided above the substrate and contacting an upper surface of the active pattern, the insulation pattern extending in the second direction; channels spaced apart from each other along a third direction perpendicular to the upper surface of the substrate, each of the channels extending in the first direction and including a material provided in the active pattern; and a gate structure contacting an upper surface of the insulation pattern, an upper surface of the channels, a lower surface of the channels, and sidewalls of the channels opposite to each other along the second direction, the gate structure extending in the second direction. A first distance between an upper surface of the active pattern and a lowermost one of the channels is greater than a second distance between an upper surface of one of the channels and a lower surface of an adjacent channel.

According to example embodiments, a semiconductor device includes: an active pattern provided on a substrate having an upper surface that extends in a first direction and a second direction that crosses the first direction, the active pattern extending in the first direction; an insulation pattern provided above the substrate and contacting an upper surface of the active pattern, the insulation pattern extending in the second direction; a gate structure contacting an upper surface of the insulation pattern, the gate structure extending in the second direction; and channels spaced apart from each other along a third direction perpendicular to the upper surface of the substrate, each of the channels extending through the gate structure along the first direction and including a material provided in the active pattern. A first thickness of a portion of the gate structure between the upper surface of the insulation pattern and a lowermost one of the channels is greater than a second thickness of a portion of the gate structure between adjacent channels.

According to example embodiments, a semiconductor device includes: an active pattern provided on a substrate having an upper surface that extends in a first direction and a second direction that crosses the first direction, the active pattern extending in the first direction; an insulation pattern provided above the substrate and contacting an upper surface of active pattern, the insulation pattern extending in the second direction; channels spaced apart from each other along a third direction perpendicular to the upper surface of the substrate, each of the channels extending in the first direction and including a material provided in the active pattern; a gate structure contacting an upper surface of the insulation pattern, upper surfaces of the channels, lower surfaces of the channels and sidewalls of the channels opposite to each other along the second direction, and extending in the second direction; and a source/drain layer provided on a portion of the active pattern adjacent to sidewalls of the gate structure opposite to each other along the first direction, the source/drain layer being connected to sidewalls of the channels opposite to each other along the first direction. The gate structure includes an interface pattern, a gate insulation pattern, a first gate electrode and a second gate electrode sequentially stacked from each of the upper surface of the insulation pattern, surfaces of the channels and a sidewall of the source/drain layer. A first distance between an upper surface of the active pattern and a lowermost one of the channels is greater than a second distance between an upper surface of one of the channels and a lower surface of an adjacent channel.

In the semiconductor device, a leakage current from the channel to the gate structure may be reduced or prevented, and thus the semiconductor device may have improved electrical characteristics.

BRIEF DESCRIPTION OF THE DRAWINGS

The above and other aspects, features, and advantages will be more clearly understood from the following description, taken in conjunction with the accompanying drawings, in which.

DETAILED DESCRIPTION

Hereinafter, example embodiments will be described more fully with reference to the accompanying drawings. Hereinafter in the specifications (and not necessarily in the claims), two directions substantially parallel to an upper surface of a substrate and crossing each other may be referred to as first and second directions, respectively, and a direction substantially perpendicular to the upper surface of the substrate may be referred to as a third direction. In example embodiments, the first and second directions may be substantially perpendicular to each other. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
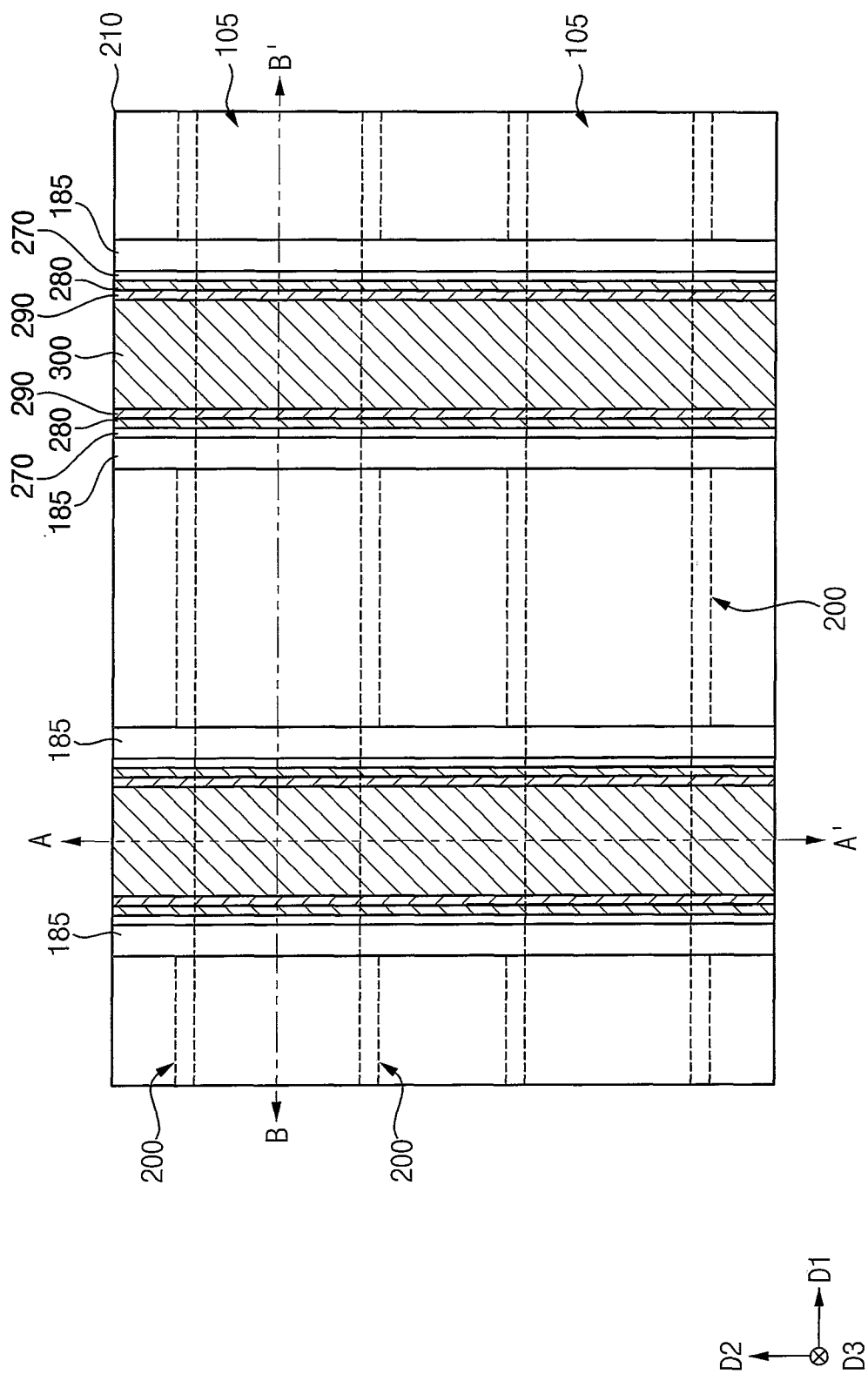
FIG. 1 is a plan view illustrating a semiconductor device according to example embodiments.
Figure 2:
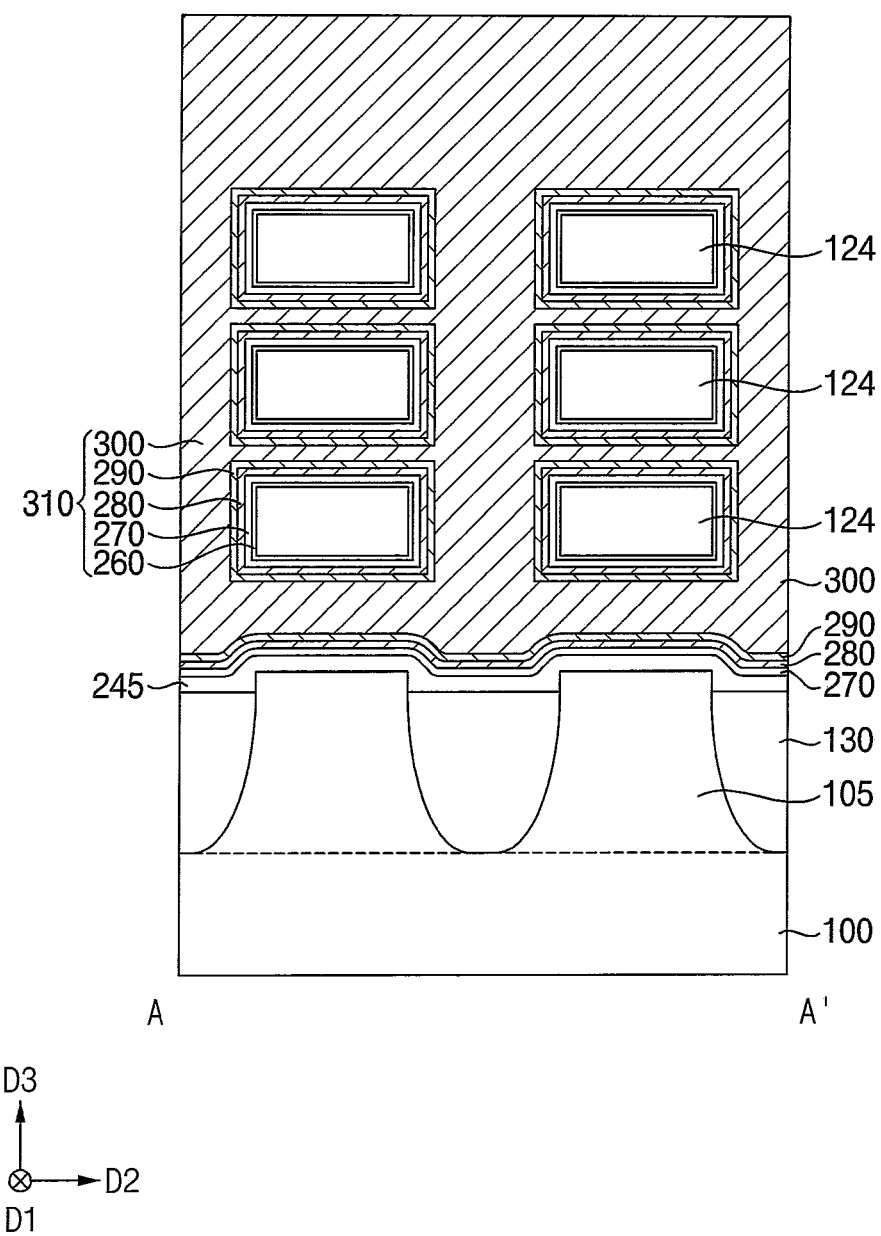
FIGS. 2 and 3 are cross-sectional views illustrating a semiconductor device according to example embodiments.
Figure 3:
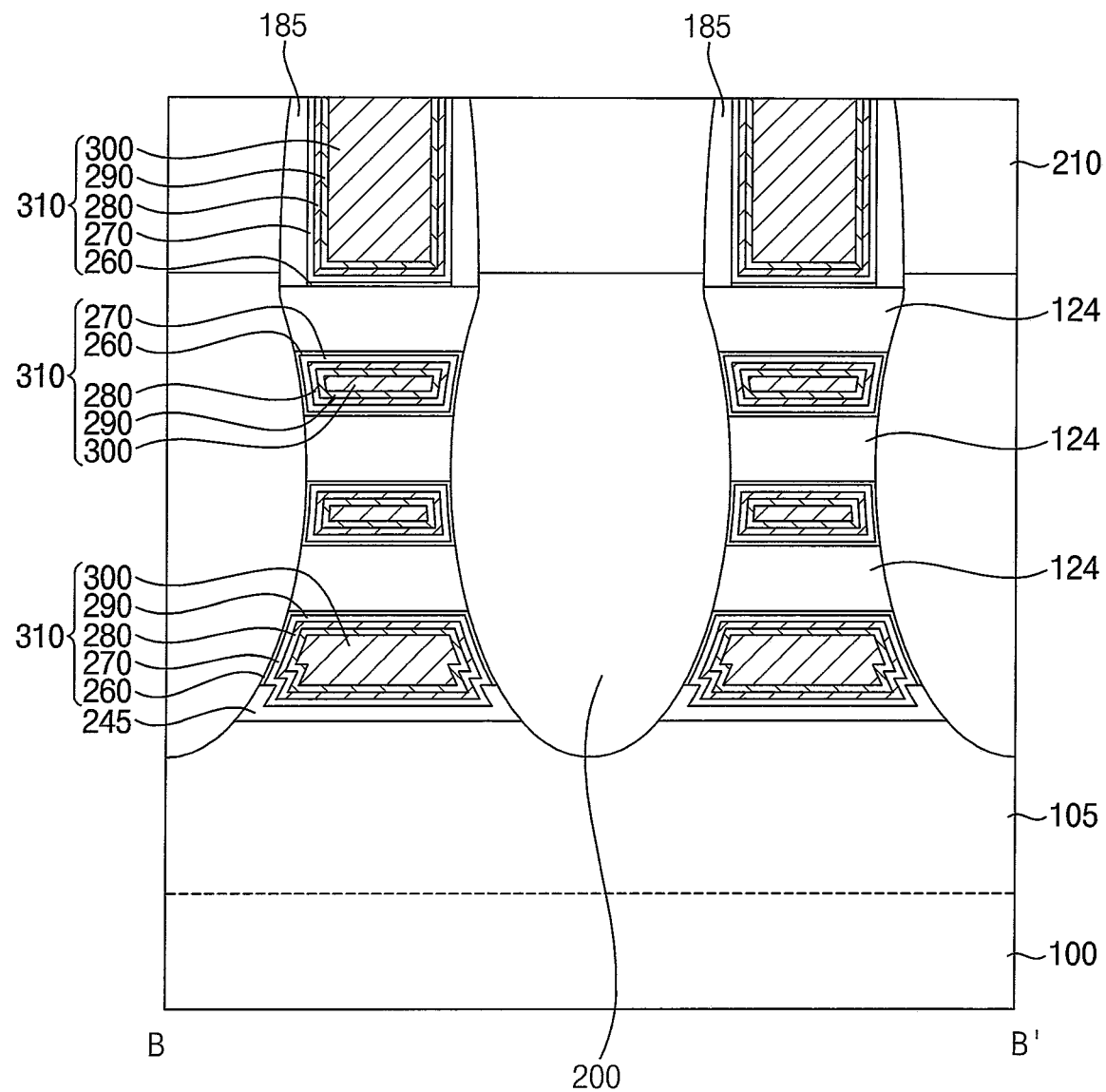

FIG. 1 is a plan view illustrating a semiconductor device in accordance with example embodiments. FIGS. 2 and 3 are cross-sectional views illustrating a semiconductor device in accordance with example embodiments. FIG. 2 is a cross-sectional view taken along line A-A' of FIG. 1, and FIG. 3 is a cross-sectional view taken along line B-B' of FIG. 1.

Referring to FIGS. 1 to 3, the semiconductor device may include an active pattern 105, an isolation pattern 130, a semiconductor pattern 124, a gate structure 310, a source/drain layer 200, and an insulation pattern 245 on a substrate 100. The semiconductor device may further include a gate spacer 185 and an insulating interlayer 210.

The substrate 100 may include a semiconductor material, e.g., silicon, germanium, silicon-germanium, etc., or III-V semiconductor compounds, e.g., GaP, GaAs, GaSb, etc.

The active pattern 105 may protrude from the substrate 100 in the third direction, and may extend along the substrate 100 in the first direction. In the drawings, two active patterns 105 are shown, however, example embodiments are not limited thereto. Thus, more than two active patterns 105 may be spaced apart from each other in the second direction. The active pattern 105 may be formed by partially removing an upper portion of the substrate 100, and thus may include a material substantially the same as that of the substrate 100.

The isolation pattern 130 may be disposed on opposite sidewalls in the second direction of the active pattern 105, and may include an oxide, e.g., silicon oxide (SiO).

The insulation pattern 245 may contact an upper surface of the active pattern 105 and an upper surface of the isolation pattern 130, and may extend in the second direction.

In example embodiments, the insulation pattern 245 may include a low-k dielectric material, e.g., silicon nitride (SiN), silicon dioxide (SiO$_2$), silicon oxycarbide (SiOC), silicon oxynitride (SiON), silicon oxycarbonitride (SiOCN), and/or silicon carbonitride (SiCN).

A plurality of semiconductor patterns 124 may be formed at a plurality of levels, respectively, over an upper surface of the insulation pattern 245 to be spaced apart from each other in the third direction. Three semiconductor patterns 124 are formed at three levels, respectively, in the drawings, however, example embodiments are not limited thereto. Additionally, two semiconductor patterns 124 are spaced apart from each other in the first direction at each of the plurality of levels on the active pattern 105 extending in the first direction. However, example embodiments are not limited thereto, and more than two semiconductor patterns 124 may be spaced apart from each other in the first direction at each of the plurality of levels on the active pattern 105.

In example embodiments, a first distance between the upper surface of the active pattern 105 and a lowermost one of the semiconductor patterns 124 may be greater than a second distance between the semiconductor patterns 124 along the third direction (i.e., between a lower surface of one of the semiconductor patterns 124 and an upper surface of an adjacent one of the semiconductor patterns 124 in the third direction), and a third distance between the upper surface of the insulation pattern 245 and the lowermost one of the semiconductor patterns 124 may be greater than the second distance. In example embodiments, the first distance may be equal to or more than about 1.1 times and equal to or less than about 4 times the second distance, and the third distance may be equal to or less than about 3.9 times the second distance. A thickness of the insulation pattern 245 may be equal to or less than about 0.5 times the first distance and equal to or more than about 0.1 times the second distance. In an example embodiment, the thickness of the insulation pattern 245 may be greater than the second distance.

In example embodiments, the semiconductor pattern 124 may include nano-sheets or nano-wires containing a semiconductor material, e.g., silicon, germanium, etc. In example embodiments, the semiconductor pattern 124 may serve as a channel of a transistor, and thus may be referred to as a channel.

The gate structure 310 may be formed on the insulation pattern 245, and may surround a central portion in the first direction each of the semiconductor patterns 124. Thus, the gate structure 310 may be disposed on lower and upper surfaces and opposite sidewalls in the second direction of the central portion of each of the semiconductor patterns 124. The gate structure 310 is disposed on the semiconductor patterns 124 on two active patterns 105 disposed in the second direction, however, example embodiments are not limited thereto. That is, the gate structure 310 may extend in the second direction to contact the upper surface of the insulation pattern 245, and may be disposed on the semiconductor patterns 124 on more than two active patterns 405 spaced apart from each other in the second direction.

Additionally, two gate structures 310 are formed in the first direction on the substrate 100 in the drawings, however, example embodiments are not limited thereto. For example, more than two gate structures 310 may be formed in the first direction.

In example embodiments, the insulation pattern 245 may be provided on a lower portion of opposite sidewalls in the first direction of the gate structure 310.

A first thickness of a portion of the gate structures 310 between the upper surface of the insulation pattern 245 and the lowermost one of the semiconductor patterns 124 may be greater than a second thickness of a portion of the gate structures 310 between the semiconductor patterns 124 arranged along the third direction. In example embodiments, the first thickness may be equal to or less than about 3.9 times the second thickness.

The gate structure 310 may include an interface pattern 260, a gate insulation pattern 270, a gate barrier 280 and first and second gate electrodes 290 and 300 sequentially stacked on a surface of each of the semiconductor patterns 124, the upper surface of the insulation pattern 245 and a sidewall of the source/drain layer 200.

The interface pattern 260 may be formed on the surface of each of the semiconductor patterns 124, the upper surface of the insulation pattern 245 and the sidewall of the source/drain layer 200, the gate insulation pattern 270 may be formed on a surface of the interface pattern 260, the upper surface of the insulation pattern 245 and an inner sidewall of the gate spacer 185, the gate barrier 280 and the first gate electrode 290 may be sequentially formed on the gate insulation pattern 270, and the second gate electrode 300 may fill a space between the semiconductor patterns 124 spaced apart from each other in the third direction, a space between the lowermost one of the semiconductor patterns 124 and the insulation pattern 245 and a space between the gate spacers 185 on an uppermost one of the semiconductor patterns 124.

The interface pattern 260 may include an oxide, e.g., silicon oxide (SiO), and the gate insulation pattern 270 may include a metal oxide having a high dielectric constant, e.g., hafnium oxide, tantalum oxide, zirconium oxide, etc.

The gate barrier 280 may include a metal nitride, e.g., titanium nitride, titanium aluminum nitride, tantalum nitride, tantalum aluminum nitride, etc, the first gate electrode 290 may include a metal alloy, a metal carbide, a metal oxynitride, a metal carbonitride, or a metal oxycarbonitride, e.g., titanium aluminum, titanium aluminum carbide, titanium aluminum oxynitride, titanium aluminum carbonitride, titanium aluminum oxycarbonitride, etc., and the second gate electrode 300 may include a low resistance metal, e.g., tungsten, aluminum, copper, tantalum, etc.

The gate spacer 185 may be disposed on each of the opposite sidewalls in the first direction of the gate structure 310 on the uppermost one of the semiconductor patterns 124, and thus may extend in the second direction.

The gate spacer 185 may include a nitride, e.g., silicon nitride. In an example embodiment, the gate spacer 185 may have a multi-layered structure including a nitride layer and an oxide layer sequentially stacked.

The source/drain layer 200 may be formed between the gate structures 310 on the active pattern 105 of the substrate 100, and may commonly contact each of opposite sidewalls in the first direction of the semiconductor patterns 124 at a plurality of levels, respectively, and may be connected thereto. An upper portion of the source/drain layer 200 may contact an outer sidewall of the gate spacer 185, and the sidewall of the source/drain layer 200 may contact the insulation pattern 245.

In an example embodiment, the source/drain layer 200 may include single crystalline silicon-germanium doped with p-type impurities, and thus may form a PMOS transistor together with the gate structure 310, the source/drain layer 200 and each of the semiconductor patterns 124 serving as a channel. A plurality of semiconductor patterns 124 may be spaced apart from each other in the third direction, and thus the semiconductor device may be a multi-bridge channel field effect transistor (MBCFET).

Alternatively, according to example embodiments the source/drain layer 200 may include single crystalline silicon doped with n-type impurities or single crystalline silicon carbide doped with n-type impurities, and thus may form a PMOS transistor together with the gate structure 310, the source/drain layer 200 and each of the semiconductor patterns 124 serving as a channel. A plurality of semiconductor patterns 124 may be spaced apart from each other in the third direction, and thus the semiconductor device may be an MBCFET.

The insulating interlayer 210 may be formed on the active pattern 105 of the substrate 100 and the isolation pattern 130, and may be disposed on a sidewall of the gate spacer 185 on each of opposite sidewalls of the gate structure 310 and an upper surface of the source/drain layer 200.

In an example embodiment, the insulation pattern 245 may be provided on a portion of the upper surface of the active pattern 105 used as a portion of the channel, and thus the active pattern 105 and the gate structure 310 may be insulated from each other by the insulation pattern 245. Accordingly, a penetration of a leakage current that may occur between the source/drain layers 200 adjacent in the first direction from the active pattern 105 into the gate structure 310 may be blocked, and a gate signal from the gate structure 310 may be blocked from leaking to the active pattern 105, so that electrical characteristics of the semiconductor device including the insulation pattern 245, the active pattern 105, the source/drain layer 200 and the gate structure 310 may be improved.

FIGS. 4 to 18 are views illustrating a method of manufacturing a semiconductor device in accordance with example embodiments. FIGS. 4, 6, 9 and 14 are plan views, and FIGS. 5, 7-8, 10-13 and 15-18 are cross-sectional views.

FIGS. 5, 7, 12, 15 and 17 are cross-sectional views taken along lines A-A' of corresponding plan views, respectively, and FIGS. 8, 10, 11, 13, 16 and 18 are cross-sectional views taken along lines B-B' of corresponding plan views, respectively.

Figure 4:
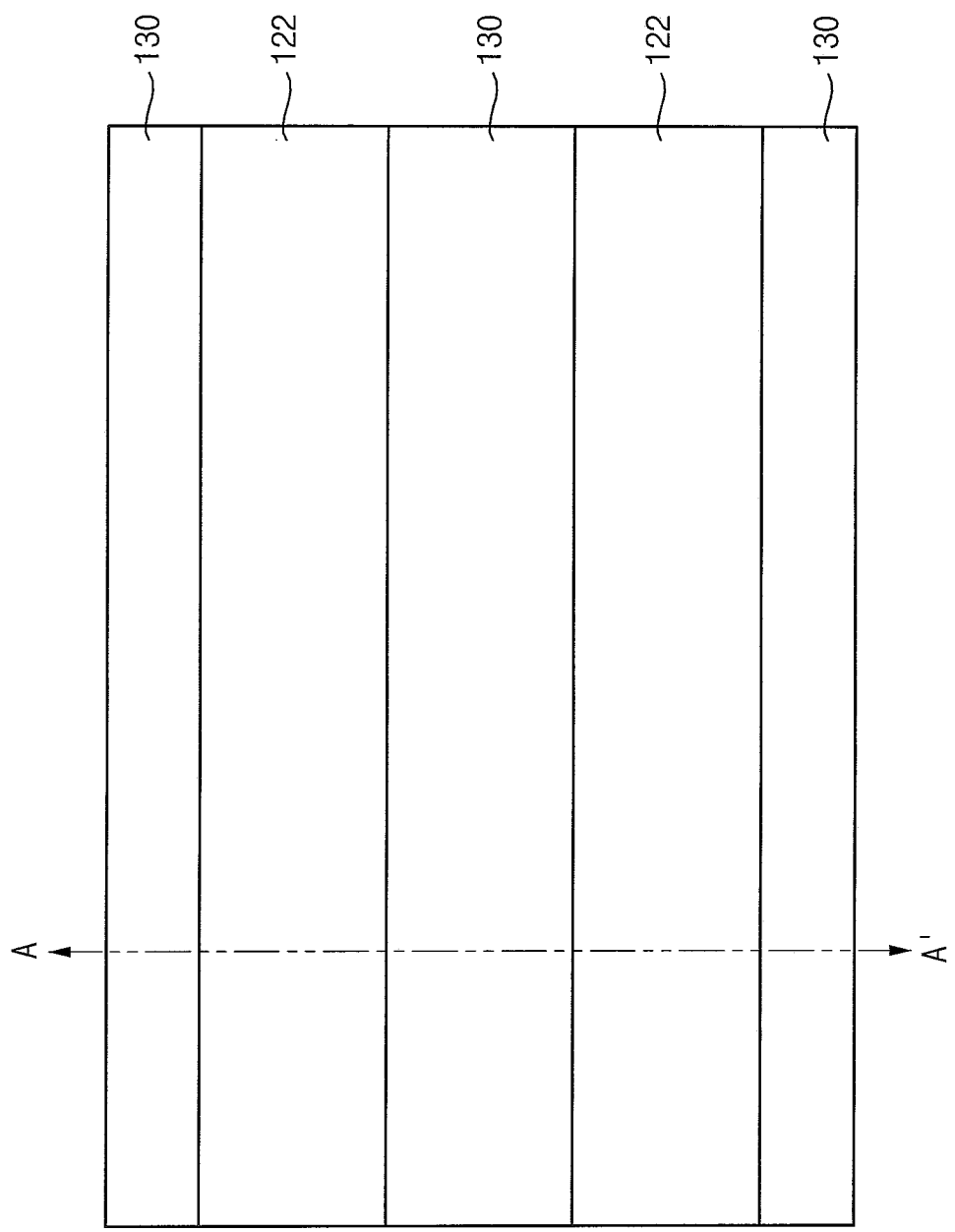
FIGS. 4 to 18 are views illustrating a method of manufacturing a semiconductor device according to example embodiments.
Figure 4:
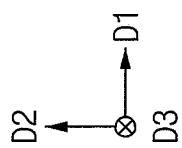
Figure 5:
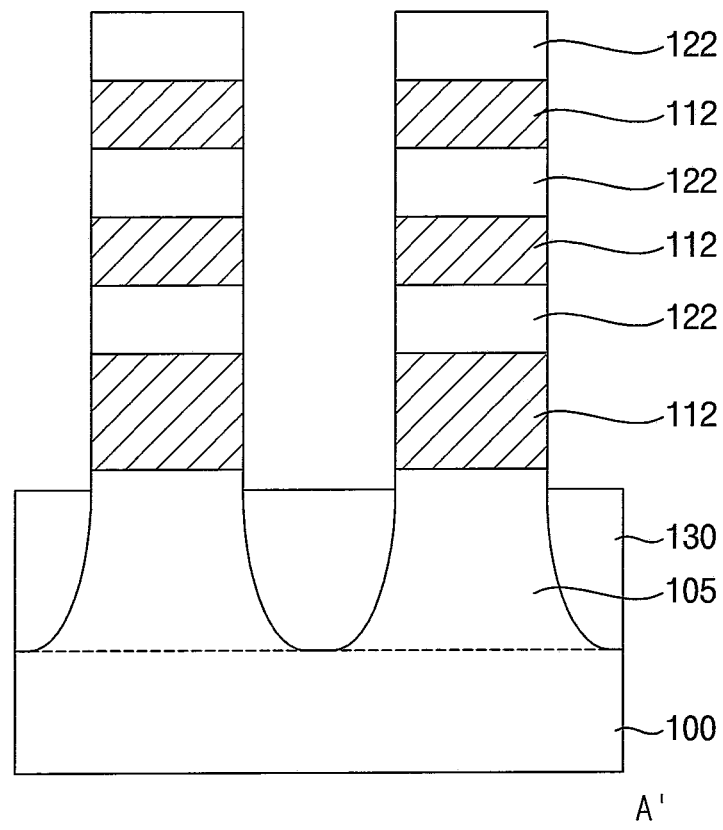
Figure 5:
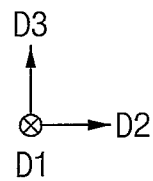

Referring to FIGS. 4 and 5, a sacrificial layer and a semiconductor layer may be alternately and repeatedly stacked on a substrate 100.

A thickness of a lowermost one of the sacrificial layers may be greater than that of one of the other sacrificial layers. The thickness of a lowermost one of the sacrificial layers may be equal to or more than about 1.1 times and equal to or less than about 4 times that of one of the other sacrificial layers.

An etching mask extending in the first direction may be formed on an uppermost one of the semiconductor layers, and the semiconductor layers, the sacrificial layers and an upper portion of the substrate 100 may be etched using the etching mask.

Thus, an active pattern 105 which extends in the first direction may be formed on the substrate 100, and a fin structure including sacrificial lines 112 and semiconductor lines 122 alternately and repeatedly stacked may be formed on the active pattern 105. In example embodiments, a plurality of fin structures may be spaced apart from each other in the second direction on the substrate 100.

Three sacrificial lines 112 and three semiconductor lines 122 are formed at three levels, respectively, in the drawings, however, example embodiments are not limited thereto. For example, more than three sacrificial lines 112 and more than three semiconductor lines 122 may be formed at more than three levels, respectively. The sacrificial lines 112 may include a material having an etching selectivity with respect to the substrate 100 and the semiconductor lines 122.

An isolation pattern 130 may be formed on the substrate 100 and may be disposed on a sidewall of the active pattern 105.

Figure 6:
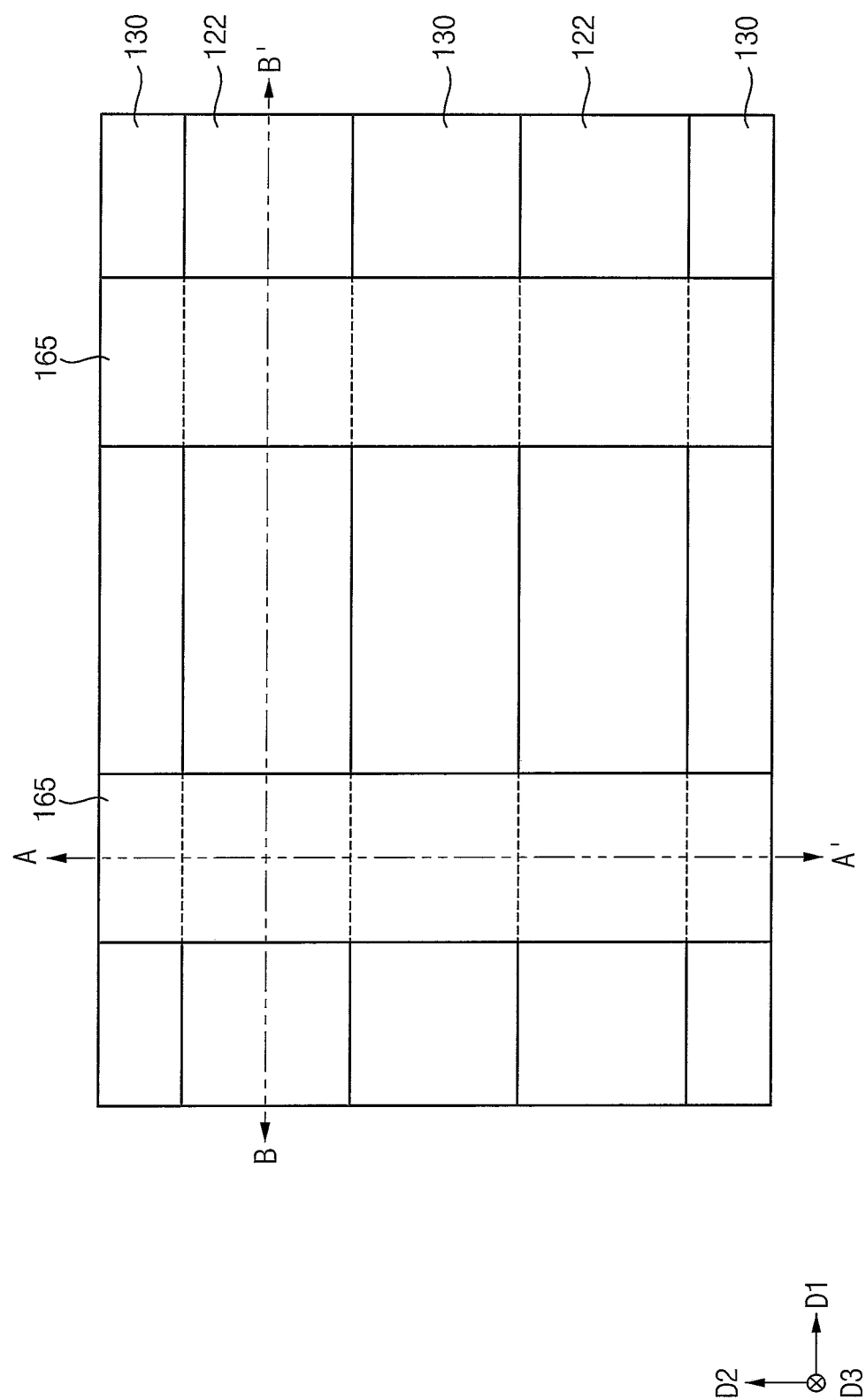
Figure 7:
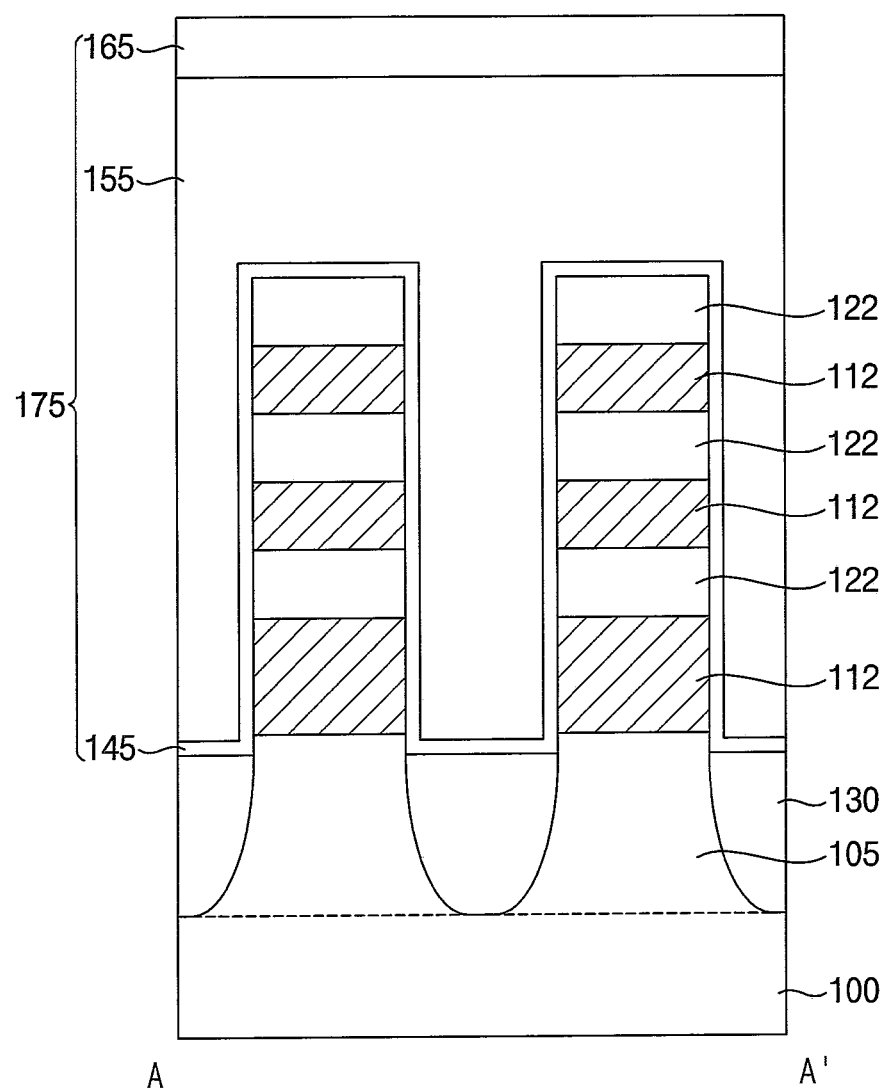
Figure 7:
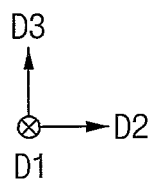
Figure 8:
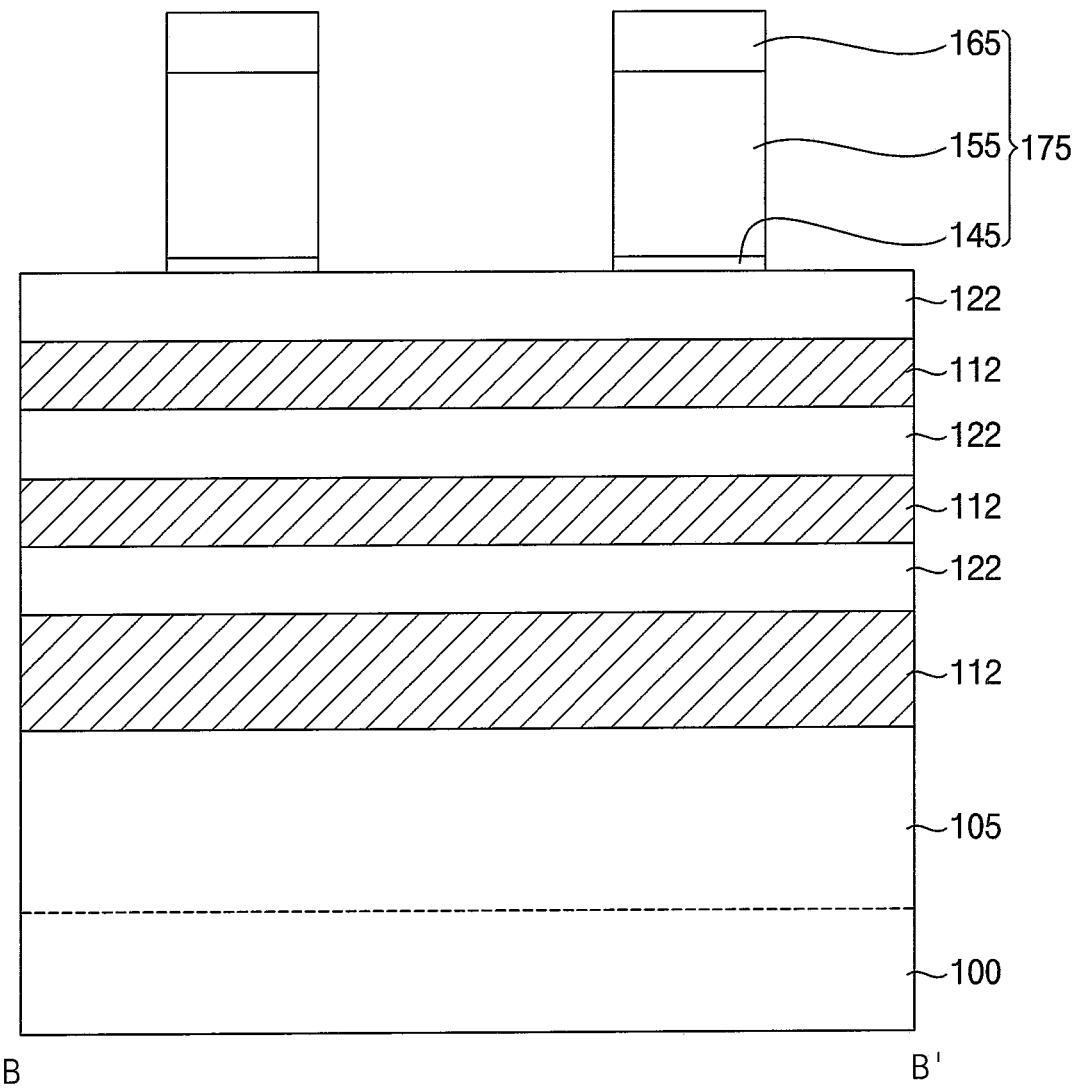

Referring to FIGS. 6 to 8, a dummy gate structure 175 may be formed on the substrate 100, the fin structure and the isolation pattern 130.

Particularly, a dummy gate insulation layer, a dummy gate electrode layer and a dummy gate mask layer may be sequentially formed on the substrate 100 having the fin structure and the isolation pattern 130 thereon, an etching mask extending in the second direction may be formed on the dummy gate mask layer, and the dummy gate mask layer may be etched using the etching mask to form a dummy gate mask 165.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the dummy gate mask 165 as an etching mask to form a dummy gate electrode 155 and a dummy gate insulation pattern 145, respectively.

The dummy gate insulation pattern 145, the dummy gate electrode 155 and the dummy gate mask 165 sequentially stacked on the active pattern 105 and a portion of the isolation pattern 130 adjacent thereto may form a dummy gate structure 175. In example embodiments, the dummy gate structure 175 may extend in the second direction on the fin structure and the isolation pattern 130, and may be disposed on an upper surface and opposite sidewalls in the second direction of the fin structure.

Figure 9:
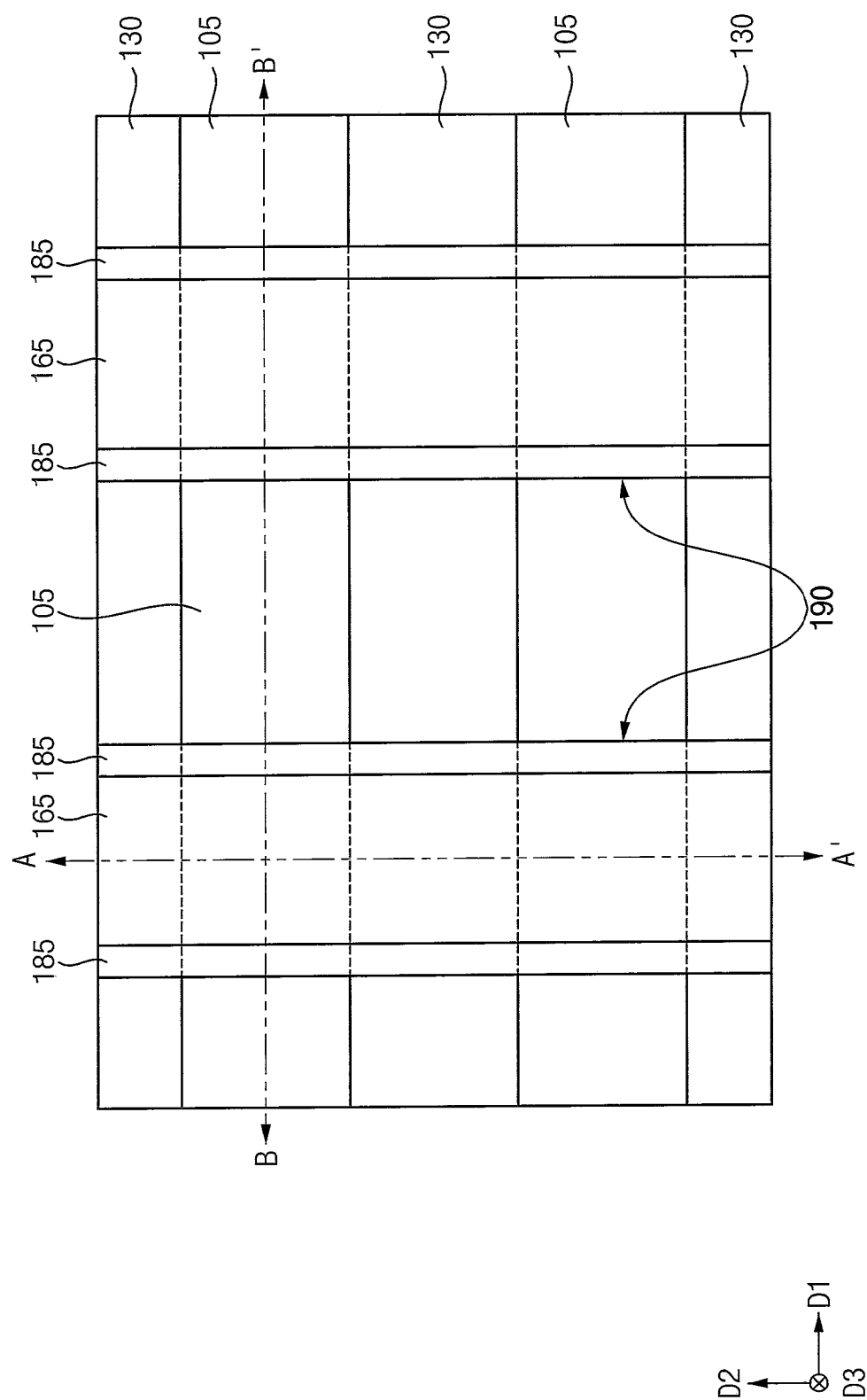
Figure 10:
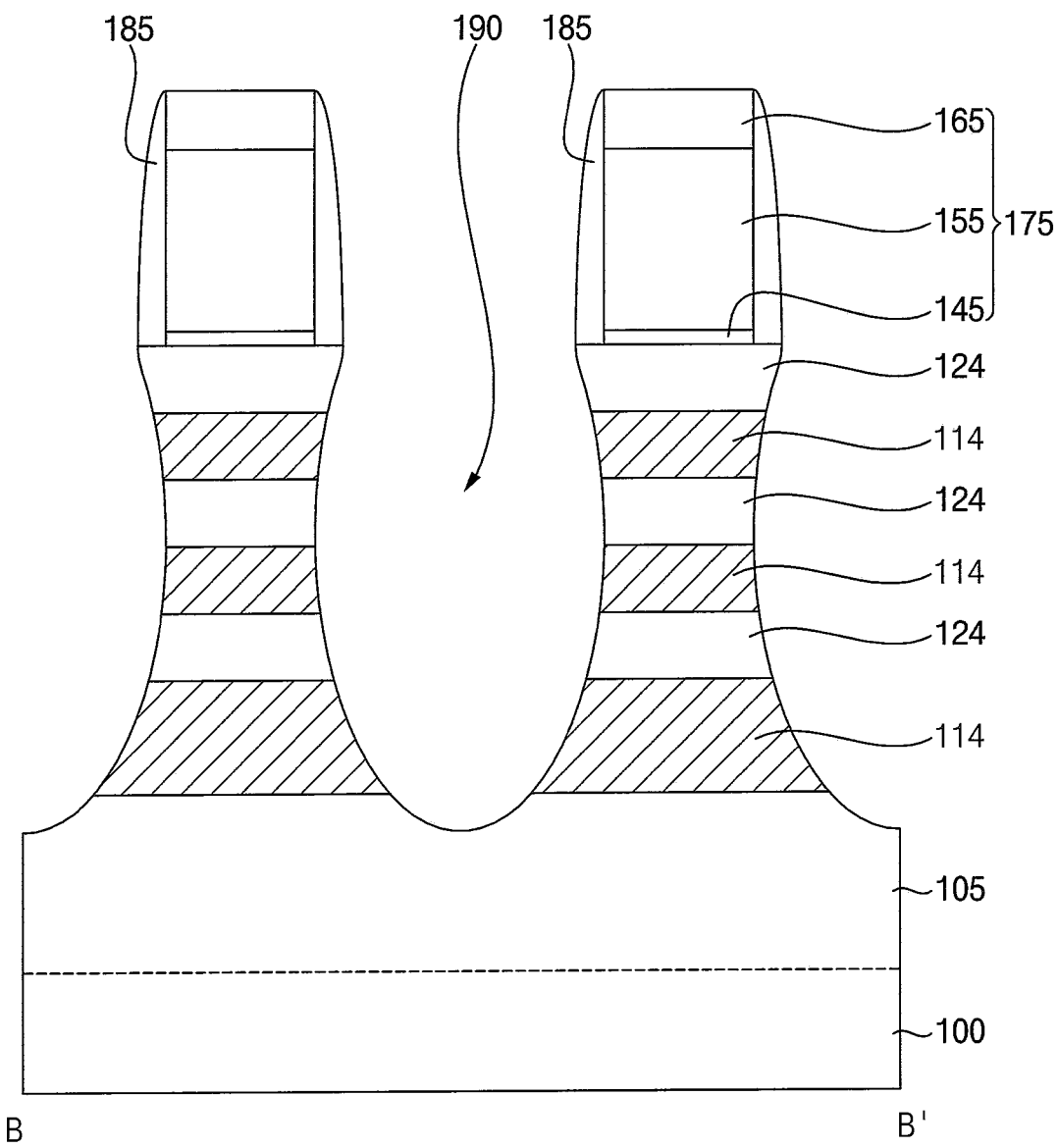

Referring to FIGS. 9 and 10, a gate spacer 185 may be formed on a sidewall of the dummy gate structure 175.

Particularly, a spacer layer may be formed on the fin structure, the isolation pattern 130 and the dummy gate structure 175. The spacer layer may be anisotropically etched to form the gate spacer 185 on each of opposite sidewalls in the first direction of the dummy gate structure 175.

The fin structure and an upper portion of the active pattern 105 thereunder may be etched using the dummy gate structure 175 and the gate spacer 185 as an etching mask to form a first opening 190.

Thus, the sacrificial lines 112 and the semiconductor lines 122 under the dummy gate structure 175 and the gate spacer 185 may be transformed into sacrificial patterns 114 and semiconductor patterns 124, respectively, and the fin structure extending in the first direction may be divided into a plurality of pieces spaced apart from each other in the first direction.

Hereinafter, the dummy gate structure 175, the gate spacers 185 on opposite sidewalls in the first direction of the dummy gate structure 175, and the fin structure may be referred to as a first structure. In example embodiments, the first structure may extend in the second direction, and a plurality of first structures may be spaced apart from each other in the first direction.

In an example embodiment, the first opening 190 may be formed to have a maximum volume. In this regard, a sidewall of the first opening 190 may have a convex shape. Sidewalls in the first direction of the semiconductor patterns 124 may not be perpendicular but slanted with respect to an upper surface of the substrate 100. Thus, lengths in the first direction of the semiconductor patterns 124 may not be constant in the third direction.

Alternatively, in an example embodiment, the sidewall of the first opening 190 may be substantially perpendicular with respect to the upper surface of the substrate 100, and the lengths in the first direction of the semiconductor patterns 124 may be constant.

A portion of each of the sacrificial patterns 114 adjacent to the first opening 190 may be removed to form a gap, and an inner spacer may be formed to fill the gap.

Figure 11:
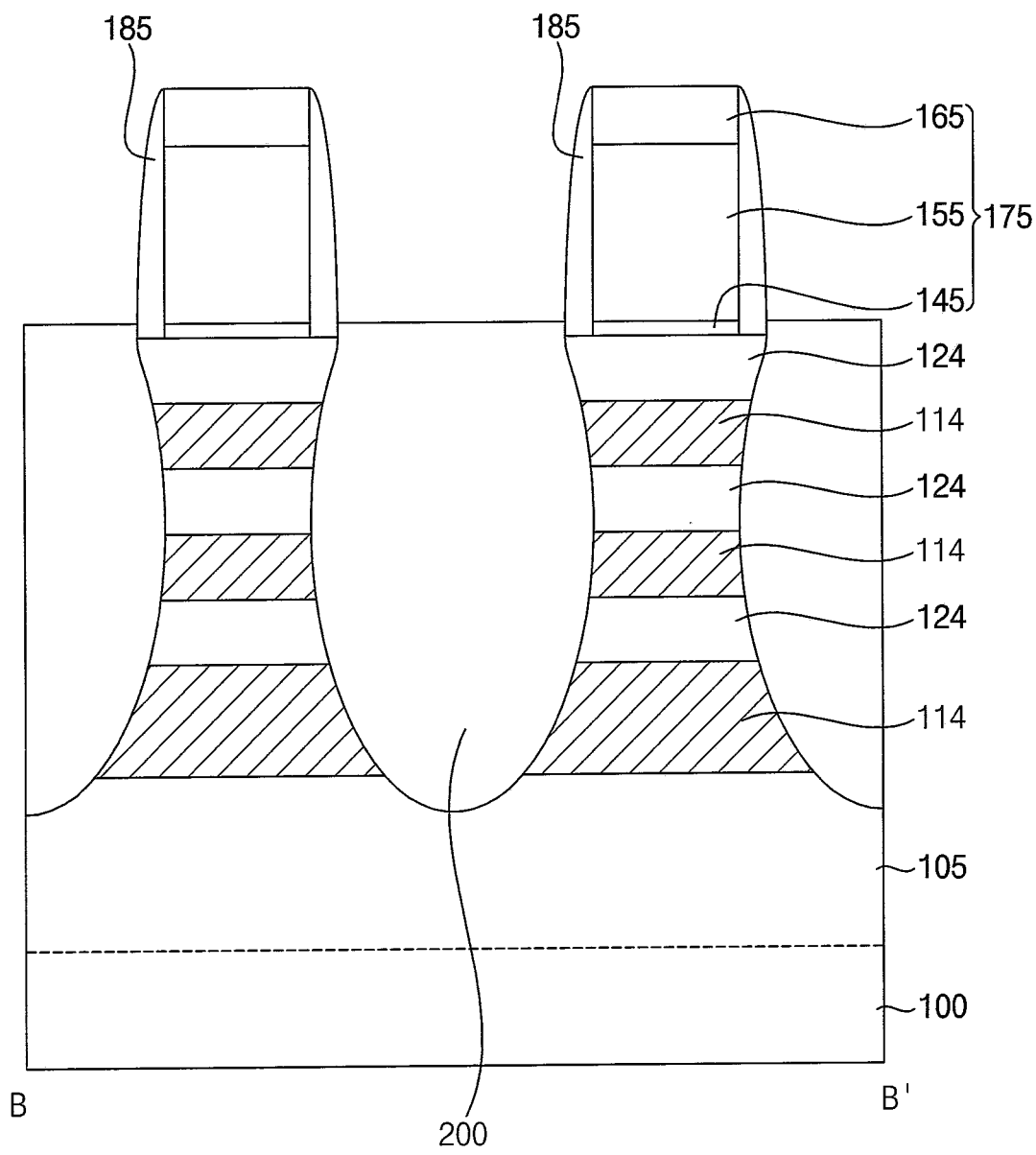

Referring to FIG. 11, a selective epitaxial growth (SEG) process may be performed using sidewalls of the semiconductor patterns 124 and the sacrificial patterns 114 and the upper surface of the active pattern 105 exposed by the first opening 190 as a seed to form a source/drain layer 200 on an inner wall of the first opening 190.

In an example embodiment, the SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the source/drain layer 200. In an example embodiment, an upper portion of the source/drain layer 200 may contact an outer sidewall of the gate spacer 185.

Alternatively, in an example embodiment, the SEG process may be performed using a silicon source gas, e.g., disilane ($Si_2H_6$) gas and n-type impurity source gas, e.g., $PH_3$, $POCl_3$, $P_2O_5$, so that a single crystalline silicon layer doped with n-type impurities may be formed as the source/drain layer 200.

Figure 12:
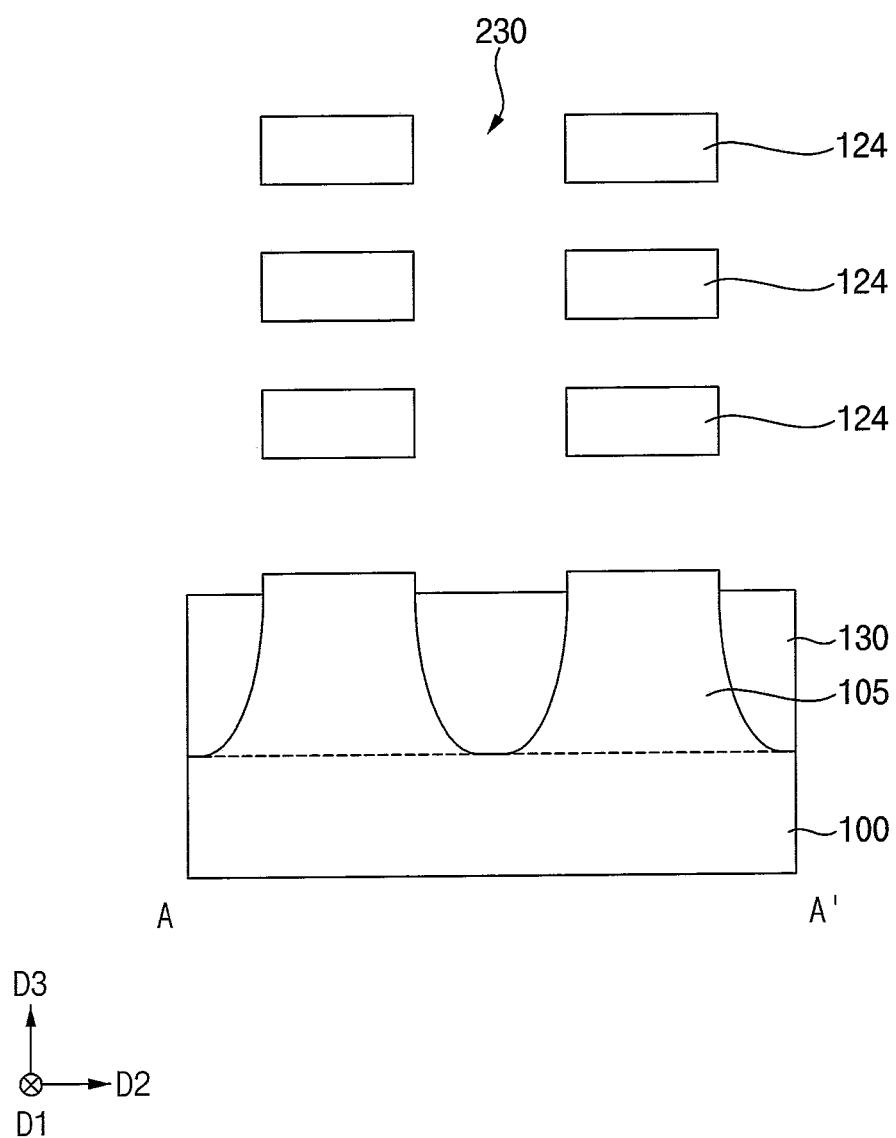
Figure 13:
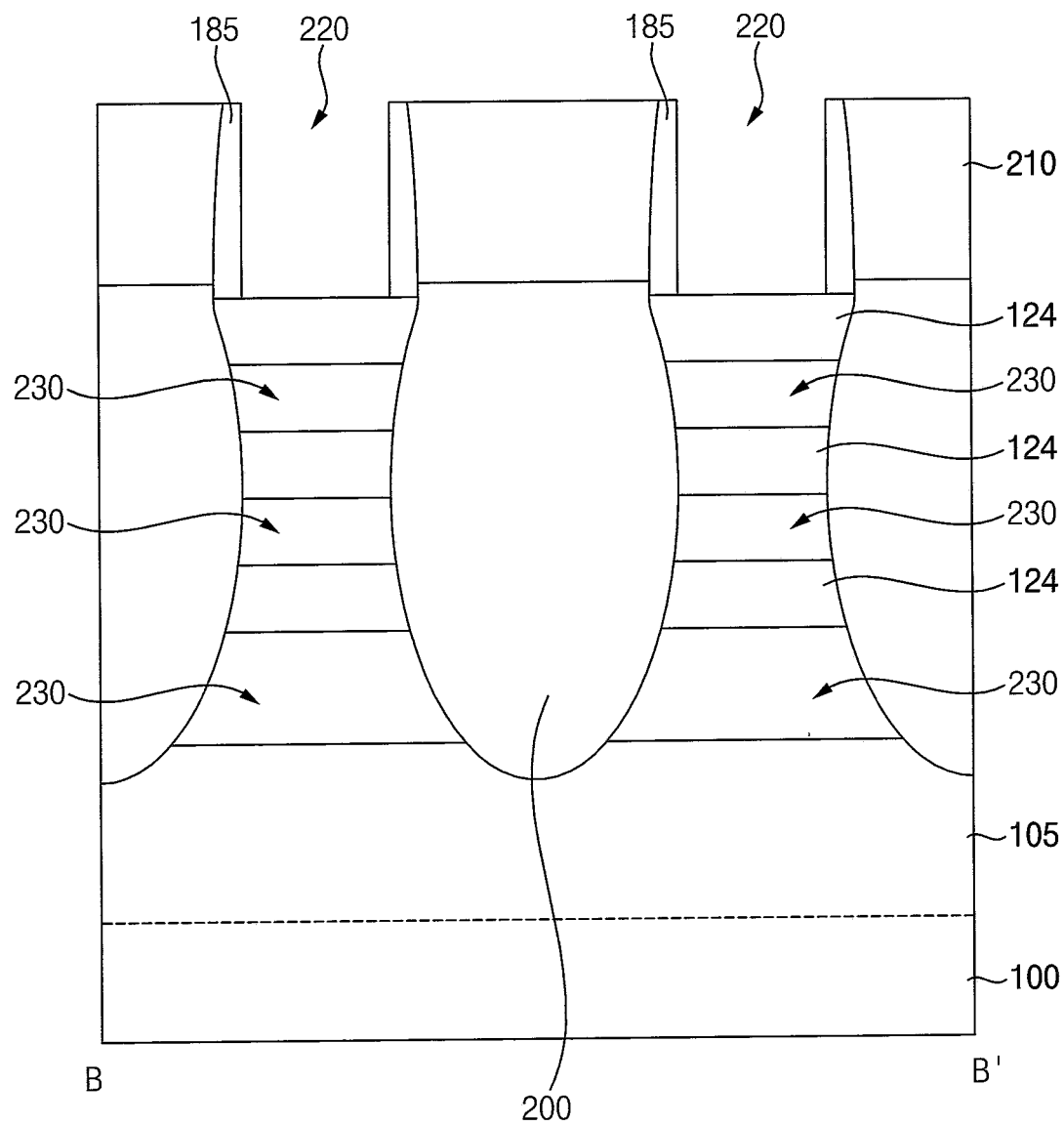

Referring to FIGS. 12 and 13, an insulating interlayer 210 may be formed on the substrate 100, the first structure and the source/drain layer 200, and may be planarized until the dummy gate electrode 155 of the first structure is exposed. During the planarization process, the dummy gate mask 165 may be also removed, and an upper portion of the gate spacer 185 may be partially removed.

The planarization process may be performed by a chemical mechanical polishing (CMP) process and/or an etch back process.

The exposed dummy gate electrode 155, the dummy gate insulation pattern 145 and the sacrificial patterns 114 may be removed by, e.g., a wet etching process and/or a dry etching process to form a second opening 220 exposing an inner sidewall of the gate spacer 185 and an upper surface of an uppermost one of the semiconductor patterns 124, and to form a third opening 230 exposing a sidewall of the source/drain layer 200, surfaces of the semiconductor patterns 124 and an upper surface of the active pattern 105.

A first distance between the upper surface of the active pattern 105 and a lowermost one of the semiconductor patterns 124 may be greater than a second distance between the semiconductor patterns 124 along the third direction (i.e., between a lower surface of one of the semiconductor patterns 124 and an upper surface of an adjacent one of the semiconductor patterns 124 in the third direction). In example embodiments, the first distance may be equal to or less than about 4 times the second distance. If the first distance is more than about 4 times the second distance, a time performing the wet etching process and/or the dry etching process may be increased, and thus an etching selectivity with respect to the semiconductor patterns 124 may be deteriorated, so that a portion of the semiconductor patterns 124 may also be etched together with the exposed dummy gate electrode 155, the dummy gate insulation pattern 145 and the sacrificial patterns 114.

Figure 14:
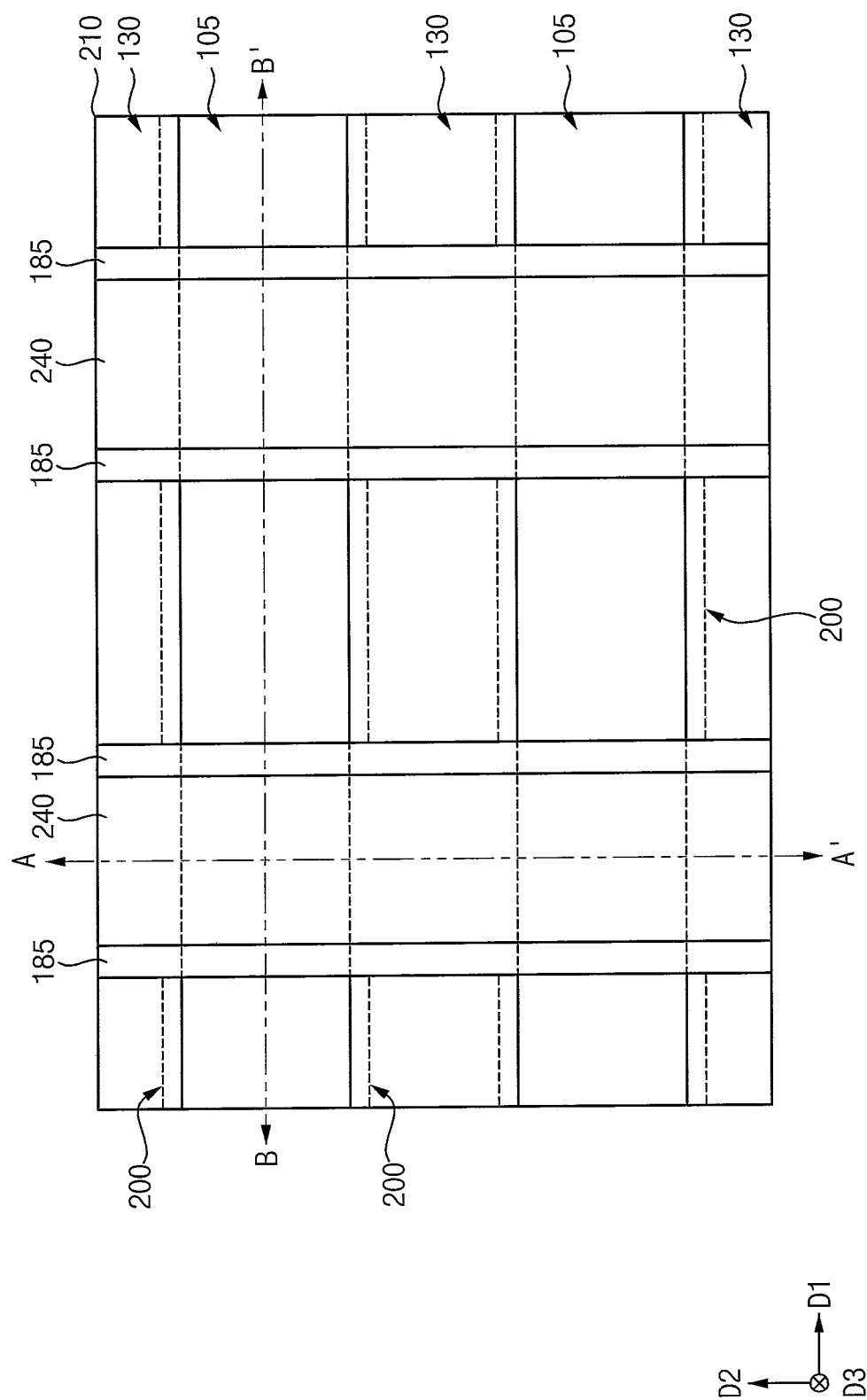
Figure 15:
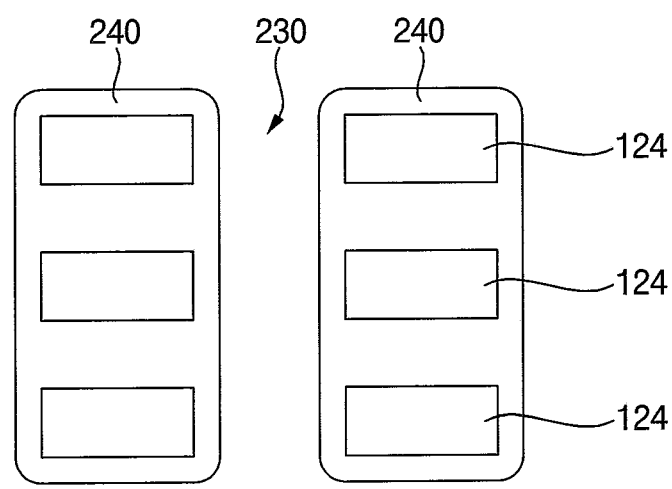
Figure 15:
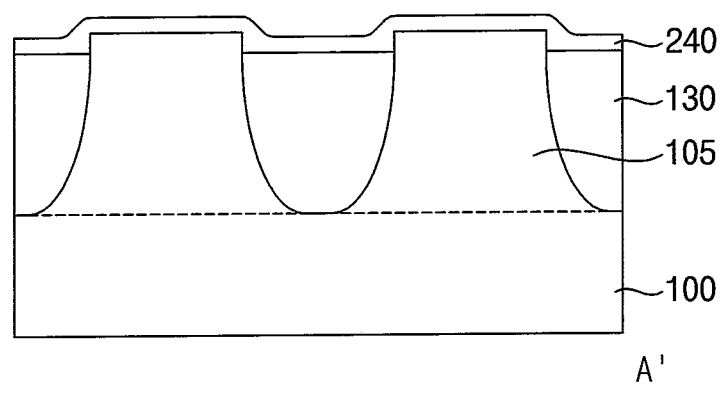
Figure 15:
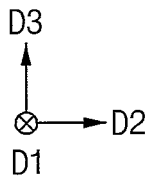
Figure 16:
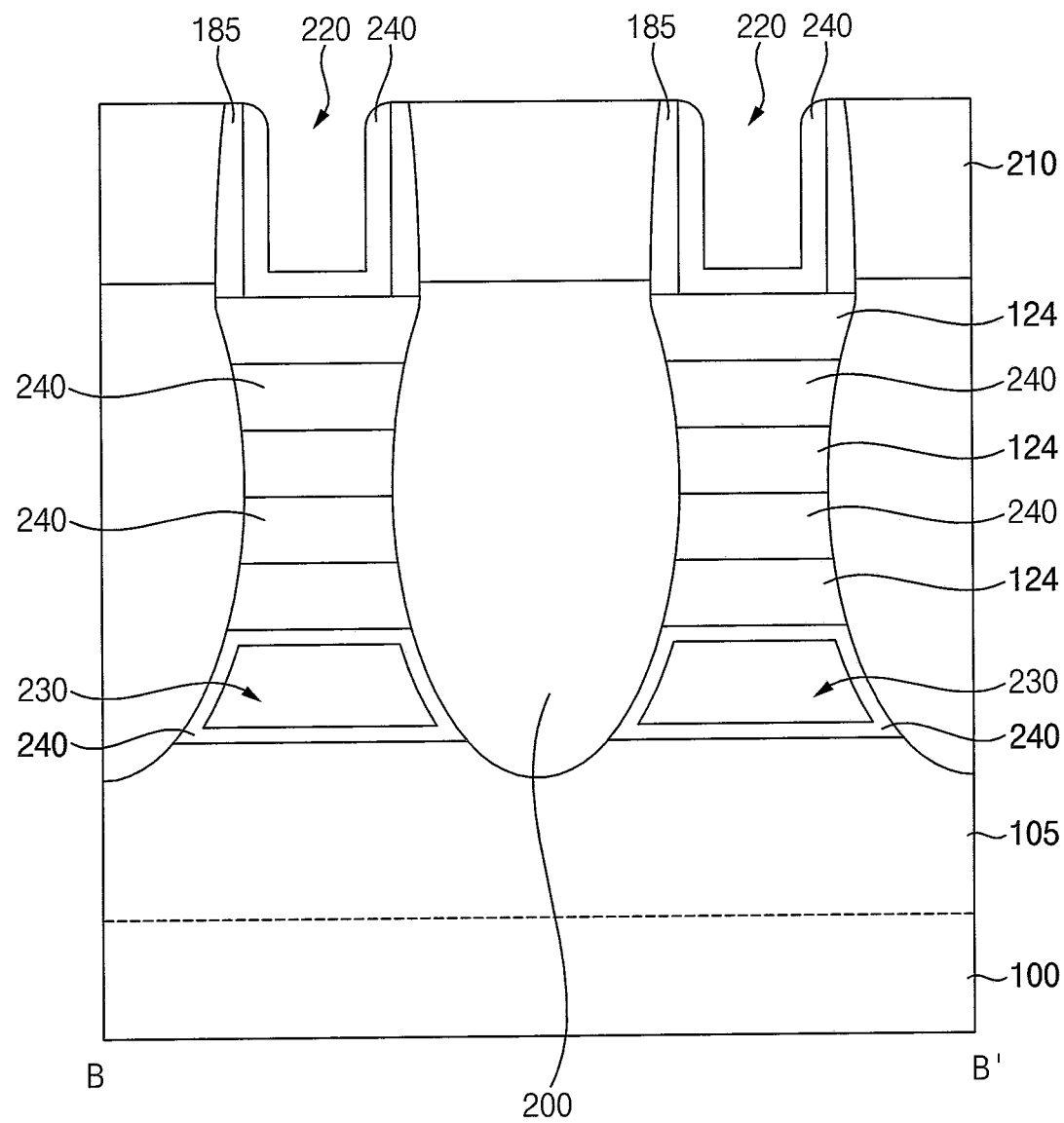

Referring to FIGS. 14 to 16, an insulation layer 240 may be formed on the surfaces of the semiconductor patterns 124, the upper surface and a portion of the sidewall of the active pattern 105, an upper surface of the isolation pattern 130, the sidewall of the source/drain layer 200 and the inner sidewall of the gate spacer 185.

A portion of the third opening 230 between the semiconductor patterns 124 spaced apart from each other in the third direction may be completely filled with the insulation layer 240. However, the first distance may be greater than the second distance, and thus the portion of the third opening 230 between the semiconductor patterns 124 may not be completely filled with the insulation layer 240. The second opening 220 may also not be completely filled with the insulation layer 240.

In example embodiments, the insulation layer 240 may be formed by, e.g., a chemical vapor deposition (CVD) process or an atomic layer deposition (ALD) process.

Figure 17:
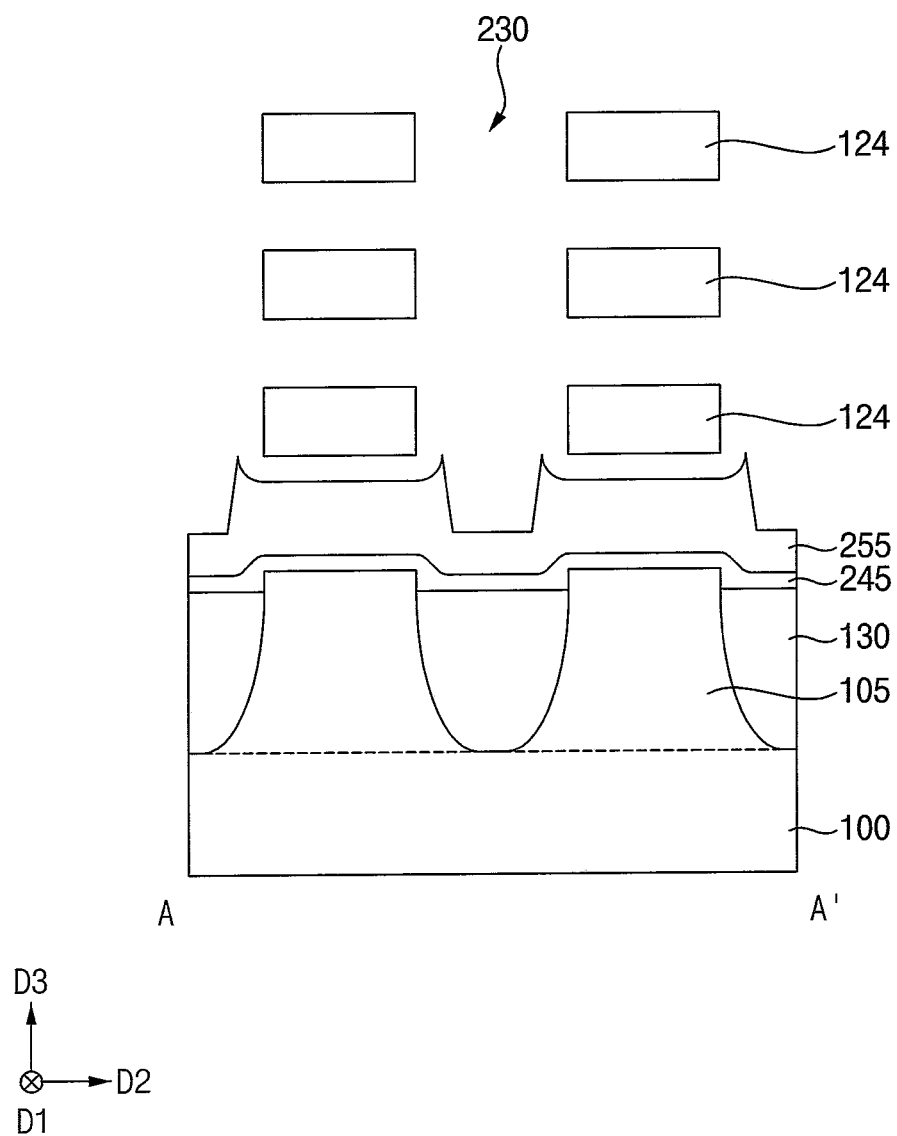
Figure 18:
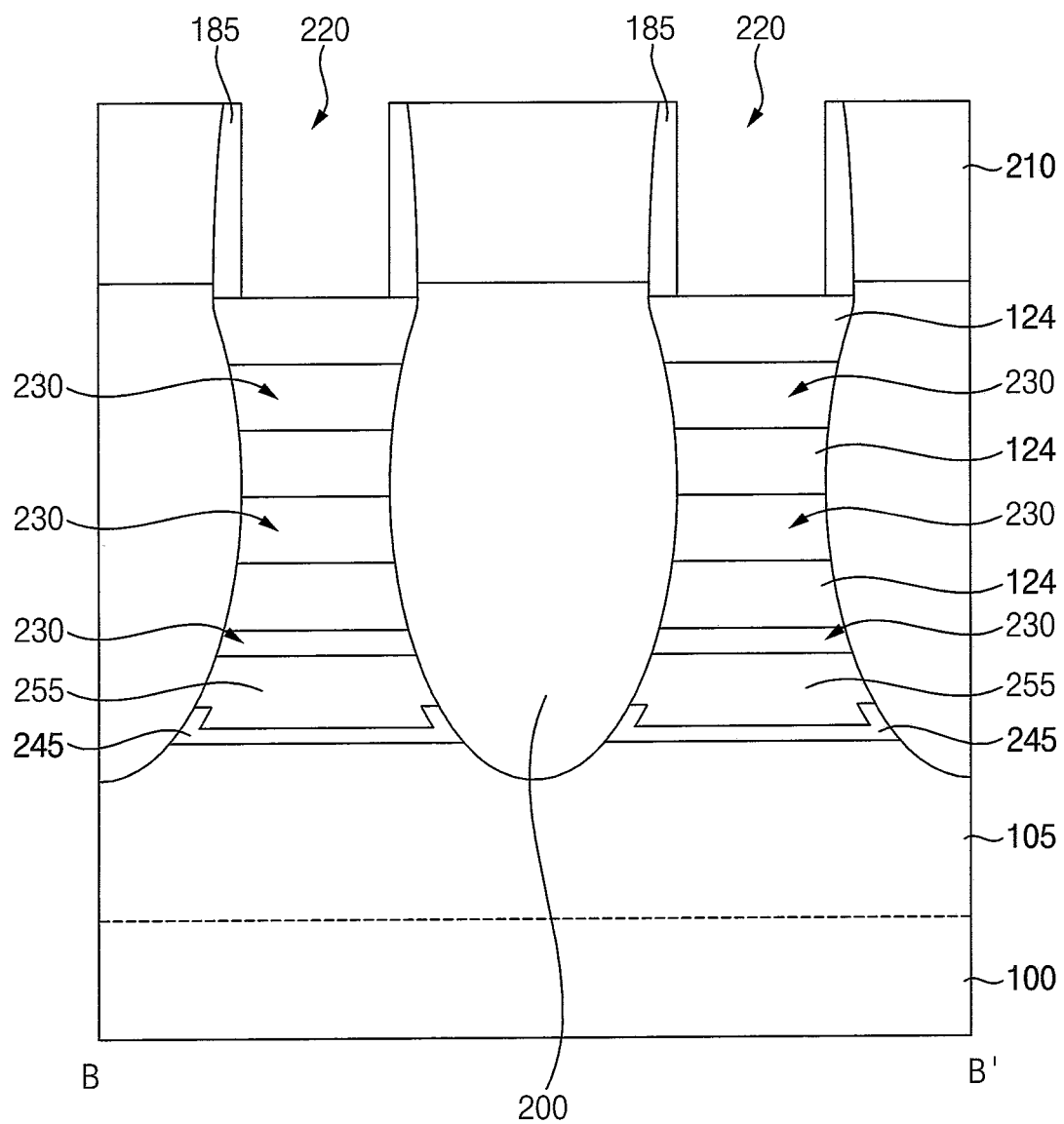

Referring to FIGS. 17 and 18, a hard mask layer may be formed on the insulation layer 240, and a hard mask 255 may be formed to expose a portion of the insulation layer 240 on the semiconductor patterns 124 and at least partially cover a portion of the insulation layer 240 on the active pattern 105 and the isolation pattern 130 by removing an upper portion of the hard mask layer through, e.g., an etch back process. The hard mask 255 may be formed to completely fill a space formed by a portion of the insulation layer 240 between the upper surface of the active pattern 105 and the lowermost one of the semiconductor patterns 124.

A portion of the insulation layer 240 exposed by the hard mask 255 may be removed, and thus a portion of the insulation layer 240 covered by the hard mask 255 on the active pattern 105 and the isolation pattern 130 may remain as an insulation pattern 245. In example embodiments, the portion of the insulation layer 240 exposed by the hard mask 255 may be removed by, e.g., a wet etching process. The insulation pattern 245 may extend in the second direction.

In example embodiments, the first distance may be equal to or more than about 1.1 times the second distance. If the first distance is less than about 1.1 times the second distance, a portion of the third opening 230 between the upper surface of the active pattern 105 and the lowermost one of the semiconductor patterns 124 may not be completely filled by the insulation layer 240, and thus the hard mask 255 may not be formed in the portion of the third opening 230.

In example embodiments, a thickness of the insulation pattern 245 may be equal to or less than about 0.5 times the first distance, and may be equal to or more than about 0.1 times the second distance. If the thickness of the insulation pattern 245 is less than about 0.1 times the first distance, the insulation pattern 245 may not block a leakage current penetrating into the gate structure 310. If the thickness of the insulation pattern 245 is more than about 0.5 times the first distance, a parasitic capacitance of the insulation pattern 245 may increase.

Referring back to FIGS. 1 to 3, the hard mask 255 may be removed, and a gate structure 310 may be formed on the insulation pattern 245 to fill the second and third openings 220 and 230.

Particularly, a thermal oxidation process may be performed on the surfaces of the semiconductor patterns 124 and the sidewall of the source/drain layer 200 exposed by the second and third openings 220 and 230 to form an interface pattern 260, a gate insulation layer, a gate barrier layer and a first gate electrode layer may be sequentially and conformally formed on a surface of the interface pattern 260, an inner sidewall and an upper surface of the gate spacer 185 and an upper surface of the insulating interlayer 210, and a second gate electrode layer may be formed to fill remaining portions of the second and third openings 220 and 230.

The gate insulation layer, the gate barrier layer, and the first and second gate electrode layers may be formed by, e.g., a CVD process, an ALD process, a physical vapor deposition (PVD) process, etc. In some embodiments, the interface pattern 260 may be formed by a CVD process, an ALD process, etc., instead of the thermal oxidation process, and may be also formed on an upper surface of the insulation pattern 245, the inner sidewall and the upper surface of the gate spacer 185 and the upper surface of the insulating interlayer 210.

The first and second gate electrode layers, the gate barrier layer and the gate insulation layer may be planarized until the upper surface of the insulating interlayer 210 is exposed, so that first and second gate electrodes 290 and 300, a gate barrier 280, and a gate insulation pattern 270 may be formed. The interface pattern 260, the gate insulation pattern 270, the gate barrier 280, and the first and second gate electrodes 290 and 300 may form the gate structure 310, and the first and second gate electrodes 290 and 300 may form a gate electrode structure.

Semiconductor devices consistent with example embodiments may be manufactured by the above processes.

As described above, in the fin structure including the sacrificial lines 112 and the semiconductor lines 122 alternately and repeatedly stacked, a lowermost one of the sacrificial lines 112 may be formed to have a thickness greater than a thickness of one of the other sacrificial lines 112. Accordingly, the insulation pattern 245 may be formed to fill a portion of the third opening 230 between the upper surface of the active pattern 105 and the lowermost one of the semiconductor patterns 124 among the third openings 230 formed by removing the sacrificial lines 112 or the sacrificial patterns 114. The insulation pattern 245 may be disposed on the upper surface of the active pattern 105, and thus a penetration of a leakage current from the active pattern 105 into the gate structure 310 may be blocked, and a gate signal from the gate structure 310 may be blocked from leaking to the active pattern 105.

While aspects of example embodiments have been shown and described, it will be understood by those of ordinary skill in the art that various changes in form and details may be made thereto without departing from the spirit and scope of the present disclosure as set forth in the following claims.

What is claimed is:

1. A semiconductor device comprising:
   an active pattern provided on a substrate having an upper surface that extends in a first direction and a second direction that crosses the first direction, the active pattern extending in the first direction;
   an isolation pattern provided on the substrate between the active pattern and an adjacent active pattern;
   an insulation pattern provided above the substrate and contacting an upper surface of the active pattern, the insulation pattern extending beyond a sidewall of the active pattern in the second direction to an upper surface of the isolation pattern;
   channels spaced apart from each other along a third direction perpendicular to the upper surface of the substrate, each of the channels extending in the first direction and comprising a material provided in the active pattern; and
   a gate structure contacting an upper surface of the insulation pattern, an upper surface of the channels, a lower surface of the channels, and sidewalls of the channels opposite to each other along the second direction, the gate structure extending in the second direction,
   wherein a first distance between an upper surface of the active pattern and a lowermost one of the channels is greater than a second distance between an upper surface of one of the channels and a lower surface of an adjacent channel.

2. The semiconductor device according to claim 1, wherein the insulation pattern comprises a low-k dielectric material.

3. The semiconductor device according to claim 2, wherein the insulation pattern comprises silicon nitride (SiN), silicon dioxide ($SiO_2$), silicon oxycarbide (SiOC), silicon oxynitride (SiON), silicon oxycarbonitride (SiOCN), and/or silicon carbonitride (SiCN).

4. The semiconductor device according to claim 1, wherein the active pattern comprises silicon (Si) and germanium (Ge), and
   wherein the channels comprise silicon (Si) and germanium (Ge).

5. The semiconductor device according to claim 1, wherein the first distance is equal to or greater than about 1.1 times the second distance and equal to or less than about 4 times the second distance.

6. The semiconductor device according to claim 5, wherein a thickness of the insulation pattern is equal to or less than about 0.5 times the first distance.

7. The semiconductor device according to claim 6, wherein the thickness of the insulation pattern is greater than the second distance.

8. The semiconductor device according to claim 1, wherein a third distance between the upper surface of the insulation pattern and a lower surface of the lowermost one of the channels is greater than the second distance.

9. The semiconductor device according to claim 1, wherein the insulation pattern is provided on a lower surface and a lower portion of sidewalls of the gate structure opposite to each other along the first direction.

10. A semiconductor device comprising:
an active pattern provided on a substrate having an upper surface that extends in a first direction and a second direction that crosses the first direction, the active pattern extending in the first direction;
an isolation pattern provided on the substrate between the active pattern and an adjacent active pattern;
an insulation pattern provided above the substrate and contacting an upper surface of the active pattern, the insulation pattern extending beyond a sidewall of the active pattern in the second direction to an upper surface of the isolation pattern;
a gate structure contacting an upper surface of the insulation pattern, the gate structure extending in the second direction; and
channels spaced apart from each other along a third direction perpendicular to the upper surface of the substrate, each of the channels extending through the gate structure along the first direction and comprising a material provided in the active pattern,
wherein a first thickness of a portion of the gate structure between the upper surface of the insulation pattern and a lowermost one of the channels is greater than a second thickness of a portion of the gate structure between adjacent channels.

11. The semiconductor device according to claim 10, wherein the insulation pattern comprises a low-k dielectric material.

12. The semiconductor device according to claim 11, wherein the insulation pattern comprises silicon nitride (SiN), silicon dioxide ($SiO_2$), silicon oxycarbide (SiOC), silicon oxynitride (SiON), silicon oxycarbonitride (SiOCN), and/or silicon carbonitride (SiCN).

13. The semiconductor device according to claim 10, wherein the first thickness is equal to or less than about 3.9 times the second thickness.

14. The semiconductor device according to claim 10, further comprising:
a source/drain layer provided on a portion the active pattern adjacent to the gate structure, the source/drain layer being connected to sidewalls of the channels opposite to each other along the first direction,
wherein the insulation pattern contacts a sidewall of the source/drain layer.

15. A semiconductor device comprising:
an active pattern provided on a substrate having an upper surface that extends in a first direction and a second direction that crosses the first direction, the active pattern extending in the first direction;
an isolation pattern provided on the substrate between the active pattern and an adjacent active pattern;
an insulation pattern provided above the substrate and contacting an upper surface of the active pattern, the insulation pattern extending beyond a sidewall of the active pattern in the second direction to an upper surface of the isolation pattern;
channels spaced apart from each other along a third direction perpendicular to the upper surface of the substrate, each of the channels extending in the first direction and comprising a material provided in the active pattern;
a gate structure contacting an upper surface of the insulation pattern, upper surfaces of the channels, lower surfaces of the channels and sidewalls of the channels opposite to each other along the second direction, and extending in the second direction; and
a source/drain layer provided on a portion of the active pattern adjacent to sidewalls of the gate structure opposite to each other along the first direction, the source/drain layer being connected to sidewalls of the channels opposite to each other along the first direction,
wherein the gate structure comprises an interface pattern, a gate insulation pattern, a first gate electrode and a second gate electrode sequentially stacked from each of the upper surface of the insulation pattern, surfaces of the channels and a sidewall of the source/drain layer, and
wherein a first distance between an upper surface of the active pattern and a lowermost one of the channels is greater than a second distance between an upper surface of one of the channels and a lower surface of an adjacent channel.

16. The semiconductor device according to claim 15, wherein the interface pattern comprises silicon oxide, the gate insulation pattern includes a metal oxide, and
wherein the first gate electrode and the second gate electrode comprise a metal.

17. The semiconductor device according to claim 15, wherein the insulation pattern comprises silicon nitride (SiN), silicon dioxide ($SiO_2$), silicon oxycarbide (SiOC), silicon oxynitride (SiON), silicon oxycarbonitride (SiOCN), and/or silicon carbonitride (SiCN).

18. The semiconductor device according to claim 15, wherein the first distance is equal to or greater than about 1.1 times the second distance and equal to or less than about 4 times the second distance.

19. The semiconductor device according to claim 1, wherein an interface is provided between the insulation pattern and the upper surface of the isolation pattern.

20. The semiconductor device according to claim 19, wherein the interface is formed by depositing an insulation layer on the upper surface of the isolation pattern.

* * * * *